United States Patent [19]
Gardiner et al.

[11] Patent Number: 5,362,328
[45] Date of Patent: Nov. 8, 1994

[54] APPARATUS AND METHOD FOR DELIVERING REAGENTS IN VAPOR FORM TO A CVD REACTOR, INCORPORATING A CLEANING SUBSYSTEM

[75] Inventors: Robin A. Gardiner, Bethel; Peter Van Buskirk, Newtown; Peter S. Kirlin, Bethel, all of Conn.

[73] Assignee: Advanced Technology Materials, Inc., Danbury, Conn.

[21] Appl. No.: 178,933

[22] Filed: Jan. 7, 1994

Related U.S. Application Data

[63] Continuation-in-part of Ser. No. 927,134, Aug. 7, 1992, which is a continuation-in-part of Ser. No. 807,807, Dec. 13, 1991, Pat. No. 5,204,314, which is a continuation of Ser. No. 549,389, Jul. 6, 1990, abandoned.

[51] Int. Cl.$^5$ ............................................. C23C 16/00
[52] U.S. Cl. .............................. 118/726; 134/56 R; 134/115 R
[58] Field of Search .......... 118/726; 134/56 R, 115 R

[56] References Cited
U.S. PATENT DOCUMENTS
5,204,314  4/1993  Kirlin ........................................ 505/1

*Primary Examiner*—Richard Bueker
*Attorney, Agent, or Firm*—Steven J. Hultquist

[57] ABSTRACT

A means and method for protecting a source reagent vaporizer structure from the harmful effects of solid build-up occurring during its use in chemical vapor deposition (CVD). Vaporizer structures may be used to provide a means of transferring relatively involatile source reagents or reagent solutions into CVD reactors and often are high surface area, highly efficient heat transfer structures. When vaporizers are used in CVD, often some premature decomposition of the source reagent occurs on the vaporizer element as well as some oxidative decomposition to produce solid products which cause clogging and inefficient vaporization. The invention provides both apparatus and method to periodically flush clean such vaporizer elements to increase their consistency, reliability, and average time between servicings.

13 Claims, 4 Drawing Sheets

APPARATUS AND METHOD FOR DELIVERING REAGENTS IN VAPOR FORM TO A CVD REACTOR, INCORPORATING A CLEANING SUBSYSTEM

CROSS-REFERENCE TO RELATED APPLICATIONS

This is a continuation-in-part of prior co-pending U.S. application Ser. No. 07/927,134 filed Aug. 7, 1992 in the names of Peter S. Kirlin, Robin L. Binder, Robin A. Gardiner, Peter Van Buskirk, Jiming Zhang, and Gregory Stauf, which is a continuation in part of U.S. application Ser. No. 07/807,807 filed Dec. 13, 1991 in the names of Peter S. Kirlin, Robin L. Binder, and Robin A. Gardiner and issued Apr. 20, 1993 as U.S. Pat. No. 5,204,314, which is a continuation of U.S. application Ser. No. 07/549,389, filed Jul. 6, 1990 in the same names, abandoned.

BACKGROUND OF THE INVENTION

1. Field of the Invention

This invention relates to a means and method for preventing build-up of involatile compounds and subsequent flow blockage in the source reagent vaporization zones of chemical vapor deposition reactors. The means and method of the invention protect such vaporization zones from accumulation of solid or liquid material that may result in clogging by modifying the thermal conductance and surface area of the internal parts of the vaporization zone.

2. Description of the Related Art

Recently many refractory materials have been identified as having unique materials properties. The recently discovered high temperature superconducting (HTSC) materials include $YBa_2Cu_3O_x$, wherein x is from about 6 to 7.3, BiSrCaCuO, and TlBaCaCuO. Barium titanate, $BaTiO_3$, and barium strontium titanate, $Ba_xSr_{1-x}TiO_3$, have been identified as ferroelectric and photonic materials with unique and potentially very useful properties. $Ba_xSr_{1-x}Nb_2O_6$ is a photonic material whose index of refraction changes as a function of electric field and also as a function of the intensity of light upon it. Lead zirconate titanate, $PbZr_{1-x}Ti_xO_3$, is a ferroelectric material whose properties are very interesting. The Group II metal fluorides, $BaF_2$, $CaF_2$, and $SrF_2$, are materials that are useful for scintillation detecting and coating of optical fibers. Refractory oxides such as $Ta_2O_5$ are seeing expanded use in the microelectronics industry; $Ta_2O_5$ is envisioned as a thin-film capacitor material whose use may enable higher density memory devices to be fabricated.

Many of the potential applications for these materials require their use in thin film, coating, or layer form. The films or layers may also be advantageously epitaxially related to the substrate upon which they are formed. Applications in which the refractory materials may need to be deposited in film or layer form include integrated circuits, switches, radiation detectors, thin film capacitors, holographic storage media, and various other microelectronic devices.

Chemical vapor deposition (CVD) is a particularly attractive method for forming these layers because it is readily scaled up to production runs and because the electronic industry has a wide experience and an established equipment base in the use of CVD technology which can be applied to new CVD processes. In general, the control of key variables such as stoichiometry and film thickness, and the coating of a wide variety of substrate geometries is possible with CVD. Forming the thin films by CVD will permit the integration of these materials into existing device production technologies. CVD also permits the formation of layers of the refractory materials that are epitaxially related to substrates having close crystal structures.

CVD requires that the element source reagents must be sufficiently volatile to permit gas phase transport into the deposition reactor. The element source reagent must decompose in the reactor to deposit only the desired element at the desired growth temperatures. Premature gas phase reactions leading to particulate formation must not occur, nor should the source reagent decompose in the lines before reaching the reactor deposition chamber. When compounds are desired to be deposited, obtaining optimal properties requires close control of stoichiometry which can be achieved if the reagent can be delivered into the reactor in a controllable fashion. In addition, the reagents must not be so chemically stable that they do not react in the deposition chamber.

Thus a desirable CVD reagent is fairly reactive and volatile. Unfortunately, for many of the refractive materials described above, volatile reagents do not exist. Many potentially highly useful refractory materials have in common that one or more of their components are elements, such as the Group II metals barium, calcium, or strontium, or early transition metals zirconium or hafnium, for which no volatile compounds well-suited for CVD are known. In many cases, the source reagents are solids whose sublimation temperature may be very close to the decomposition temperature, in which case the reagent may begin to decompose in the lines before reaching the reactor, and it will be very difficult to control the stoichiometry of the deposited films.

When the film being deposited by CVD is a multi-component substance rather than a pure element, such as barium titanate or the oxide superconductors, controlling the stoichiometry of the film is critical to obtaining the desired film properties. In such materials, which may form films with a wide range of stoichiometries, the controlled delivery of known proportions of the source reagents into the CVD reactor chamber is required.

In other cases, the CVD reagents are liquids, but their delivery into the CVD reactor in the vapor phase has proven problematic because of problems of premature decomposition or stoichiometry control. Examples include the deposition of tantalum oxide from the liquid source tantalum ethoxide and the deposition of titanium nitride from bis(dialkylamide)titanium reagents.

The problem of controlled delivery of CVD reagents into deposition reactors was addressed by the inventors in U.S. patent application Ser. No. 07/807,807, which is a continuation of U.S. patent application Ser. No. 07/549,389, "Method for Delivering an Involatile Reagent in Vapor Form to a CVD Reactor," and further elaborated in U.S. patent application Ser. No. 07/927,134, "Apparatus and Method for Delivery of Involatile Reagents," which hereby are incorporated herein by reference. As described and claimed in these patents, the delivery of reagents into the deposition chamber in vapor form is accomplished by providing the reagent in a liquid form, neat or solution, and flowing the reagent liquid onto a flash vaporization matrix structure which is heated to a temperature sufficient to flash vaporize the reagent source liquid. A carrier gas may optionally be flowed by the flash vaporization matrix structure to form a carrier gas mixture containing the flash vaporized reagent source liquid. These "liquid delivery systems" have addressed many of the problems of controlled delivery of CVD reagents.

While these liquid delivery systems present distinct advantages over conventional techniques, there is often some fraction of the precursor compound that decomposes into very low volatility compounds that remain at the vaporization zone. This problem is a important issue in CVD processes that use thermally unstable solid source precursors which display significant decomposition at conditions needed for sublimation. Such decomposition can occur in all reagent delivery systems that involve a vaporization step, not only in the vaporizer in a liquid delivery system as described above but also in more conventional reagent delivery systems that include bubblers and heated vessels operated without carrier gas.

Although well-behaved CVD precursors vaporized under "ideal" conditions will form no deposits or residue at the vaporization zone, deviations from this situation are common and can be divided into several categories:

1) Reactive impurities in either the precursor or in the carrier gas decompose at the vaporizer temperatures.

2) Spatial and temporal temperature variations occur in the vaporization zone, with temperatures in some regions being sufficient to bring about decomposition.

3) CVD precursors are employed which are thermally unstable at the sublimation temperature.

Optimization of the conditions used in the vaporizer of reagent delivery systems can minimize the fraction of the delivered precursor that decomposes (and remains) at the vaporization zone, but virtually all solid and liquid precursors undergo some decomposition when they are heated for conversion to the gas phase, although this fraction is negligibly small in "well-behaved" compounds. Use of precursors that tend to decompose near their vaporization temperature may be mandated by availability (i.e., the selected precursor possessed the best properties of all available choices) or by economics, in the case where precursor cost is strongly dependent on the complexity of the synthesis.

Additionally, CVD precursors often contain impurities, and presence of those impurities can cause undesirable thermally activated chemical reactions at the vaporization zone, also resulting in formation of involatile solids and liquids at that location. For example, a variety of CVD precursors (such as tantalum pentaethoxide) are water sensitive and hydrolyzation can occur at the heated vaporizer zone to form tantalum oxide particulates that may be incorporated into the growing tantalum oxide film with deleterious effects.

Despite the advantages of the liquid delivery approach (which include improved precision and accuracy for most liquid and solid CVD precursors and higher delivery rates), this issue is the only serious impediment to widespread use of the technique and, accordingly, it is an object of the present invention to provide a means and method for extending the maintenance and cleaning cycles of vaporizers in liquid delivery systems used to introduce a variety of precursors to CVD reactors.

Other objects and advantages of the present invention will be more fully apparent from the ensuing disclosure and appended claims.

SUMMARY OF THE INVENTION

In one aspect, the present invention relates to a means and method for preventing build-up of involatile compounds and subsequent flow blockage in the source reagent vaporization zones of chemical vapor deposition reactors.

The invention is a method for the in-situ cleaning of the vaporization zone in either the high surface area heated zone of a liquid delivery system or in other, conventional vapor sources that include bubblers and heated vessels operated without carrier gas. The cleaning involves dissolving decomposition products produced during source vaporization, and this may be accomplished by controlled delivery of a specific fluid to the vaporization zone via a multiple position valve in the fluid plumbing line normally used for delivery of the CVD precursor to that zone or through a separate plumbing line to that location. The fluid is selected on the basis of several criteria, which include:

1) The fluid should dissolve the CVD source and decomposition products or should react with them to form soluble products.

2) To protect the integrity of the process, the fluid should be free of particles.

3) The fluid should have a high vapor pressure (>200 torr at room temperature).

The the in-situ cleaning fluid is pumped to the vaporization zone periodically, either after each deposition run or less frequently. Intervals at which cleaning occurs can be set as regular intervals, or cleaning can occur in response to a change in a variable being monitored, such as the build-up of backpressure in a vaporizer structure that is beginning to clog. The resulting solution of decomposition products and solvents is then flushed away from the vaporization zone, leaving the area clean for subsequent vaporizing of sources. The used cleaning fluid is then collected in a scrubber or a trap that can be periodically cleaned or exchanged for another which has been renewed, or alternatively is recycled for use in several cleaning cycles.

Other aspects and features of the invention will be more fully apparent from the ensuing disclosure and appended claims.

DESCRIPTION OF THE DRAWINGS

FIGS. 2a, 2b and 2c are cutaway views from three angles successively rotated 90° of a vaporizer assembly incorporating the cleaning subassembly of the present invention. The view of FIG. 2b is rotated 90° about the vertical axis from FIG. 2a. The view of FIG. 2c is rotated 180° about the vertical axis from FIG. 2a.

DETAILED DESCRIPTION OF THE INVENTION, AND PREFERRED EMBODIMENTS THEREOF

The present invention is based on the observation that under certain conditions, involatile residue can collect in a vaporizer used in a reagent delivery system for a chemical vapor deposition process. The average time taken for the build up of these decomposition products to halt the vaporization process will determine the mean time before failure (MTBF) of the liquid delivery system of which the vaporization zone is a subsystem. As the build up of decomposition products occurs they can be a cause of chemical and particulate contamination. If these issues become apparent cleaning of the vaporization zone will be necessary. The frequency of maintenance will determine the mean time to repair (MTR). Both the MTR of a system and subsequently MTBF are of utmost importance for customers using this technology. The removal of decomposition products in an efficient way reduces the contamination liability associated with the decomposition products and thus increases the MTBF.

The present invention provides a method to periodically clean the high surface area vaporization zone of the decomposition products using a suitable cleaning fluid. The resulting solution is then flushed into a container which can be removed for disposal or can be connected to provide recycle for reuse.

Figure 1:
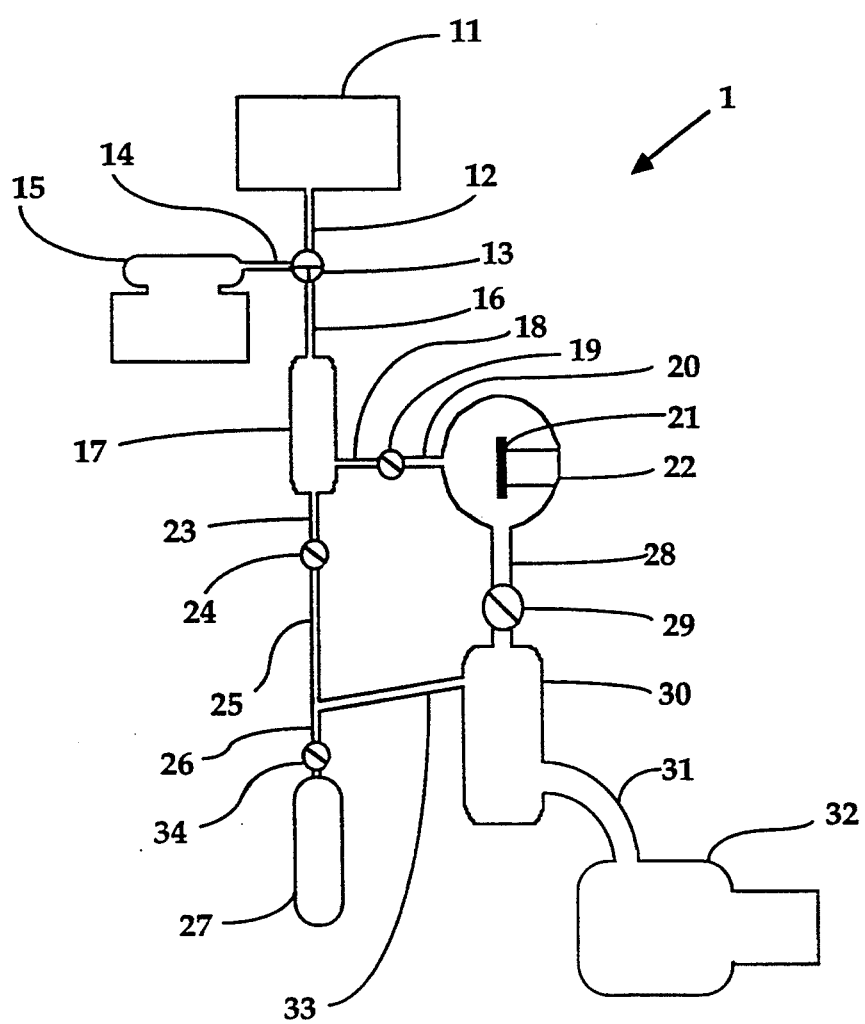
FIG. 1 is a schematic representation of a chemical vapor deposition system comprising a vaporizer flushing apparatus of the present invention. The key aspects of the system are a vaporizer at which CVD precursors are transformed either from gaseous or solids into the gas phase, which may be heated, a fluid source for introduction of cleaning liquid(s) or gas(es) to the vaporizer, a multiple position valve that allows introduction of either cleaning fluids or CVD precursors to the vaporization zone, a valve to regulate flow of gaseous precursors to the CVD reactor (on or off), a valve to regulate flow of gaseous precursors directly to the residual chemical trap (on or off), the CVD reactor, in which gas phase reactant gases undergo chemical reactions resulting in film formation on a substrate, a valve to regulate flow of gaseous precursors from the CVD reactor to the trap (on or off), a trap for residual chemicals that are collected either by condensation of flowing gases there or by collection of liquids that are comprised of involatile solid and liquid residue from the vaporizer, and a vacuum pump needed to operate the apparatus below atmospheric pressure.

A schematic of a chemical vapor deposition system 1 employing the vaporizer flush invention is shown in FIG. 1. During chemical vapor deposition of films, liquid source reagent or solid source reagent dissolved in appropriate solvent flows from reagent source reservoir 11 through fluid conduit 12 to three-way valve 13, which is in the open position. The reagent liquid flows through conduit 16 into vaporizer 17, which may be of the type described in U.S. Pat. No. 5,204,314, "Method For Delivering an Involatile Reagent in Vapor Form to a CVD Reactor," the disclosure of which is incorporated herein by reference. The vaporized source reagent flows through conduit 18, on-off valve 19 which is in the open position, and conduit 20 to the chemical vapor deposition reactor chamber 22, wherein decomposition of the source reagent occurs to deposit films on substrate 21. Decomposition may be thermal, photochemical, plasma-induced, or any other workable type of chemical vapor deposition. Waste gases from the CVD reactor, including unreacted source reagent, flow out of the reactor chamber 22, through conduit 28 and on-off valve 29 which is in the open position to trap or scrubber 30 which retains solids and liquids. The trap is connected to the vacuum pump 32 by conduit 31. The scrubber or trap 30 may be a cold trap or any of a wide variety of scrubber types as are well-known in the art. The scrubber or trap protects the vacuum pump.

Cleaning fluid is held in cleaning fluid reservoir 15, which may be a liquid vessel/pump combination in the case of liquid cleaning fluids or a gas cylinder in the case of gaseous cleaning fluids. During a cleaning cycle when the vaporizer is being flushed, cleaning fluid flows from reservoir 15 through conduit 14 to three-way valve 13, which is in the open position, and thence into the vaporizer 17, where it is caused to bathe the vaporization structure and thus clean it of any solid or liquid build-up. During the cleaning process valve 24 may be opened or closed depending on the specific pressure and flow conditions required by the cleaning process and depending on any need for extended contact times for the cleaning fluid to dissolve buildup. If valve 24 is closed for an appropriate time to allow the cleaning fluid to dissolve any build-up on the vaporizer structure, it is then opened, and the used cleaning fluid flows out of the vaporizer through conduit 23, on-off valve 24, which is now in the open position, and through conduit 25. Alternatively, valve 24 is left open for the entire period that cleaning fluids are introduced to the vaporizer 17, and the used cleaning fluids continuously flow through conduit 23 and valve 24 and into conduit 25 during the cleaning process. During cleaning cycles, on-off valve 19 is in the closed position to prevent cleaning by-products flowing to the CVD reactor vessel 22. On-off valve 29 may be open or closed depending on the nature of any parallel process being run in the CVD chamber 22. Vapors will continue to flow through conduit 33 into the scrubber or trap 30, but liquids will flow by gravity through conduit 26, on-off valve 34 which is in the open position, and into liquid collection reservoir 27. The purpose of the bypass provided by 33 is to prolong the lifetime or extend the time between changeouts or regenerations of the scrubber or trap 30, by collecting the liquids, which consist mostly of spent cleaning solution, before they can flow into the scrubber or trap. On-off valve 34 enables removal and emptying of liquid collection reservoir 27 without complications.

Figure 2A:
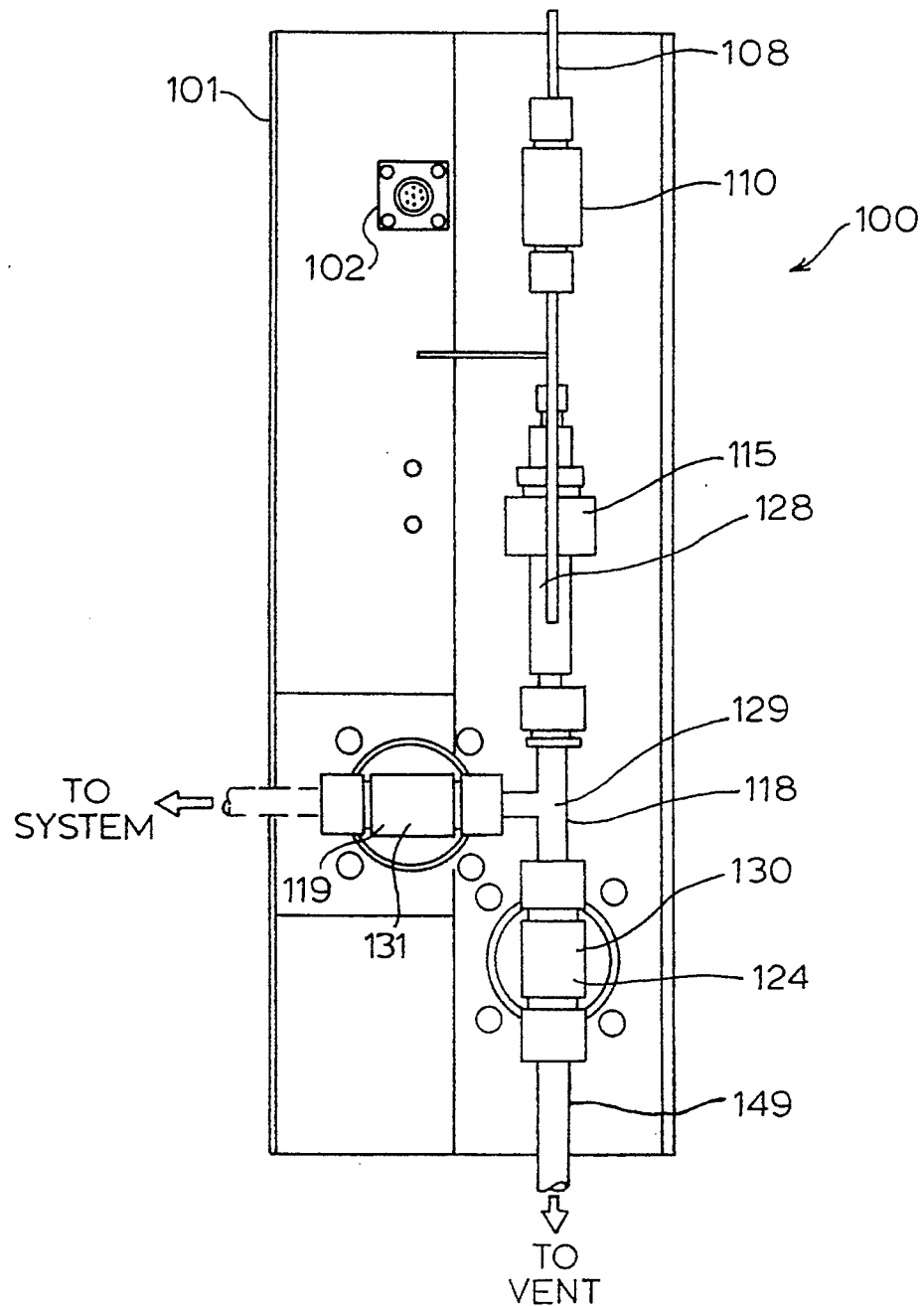
Figure 2B:
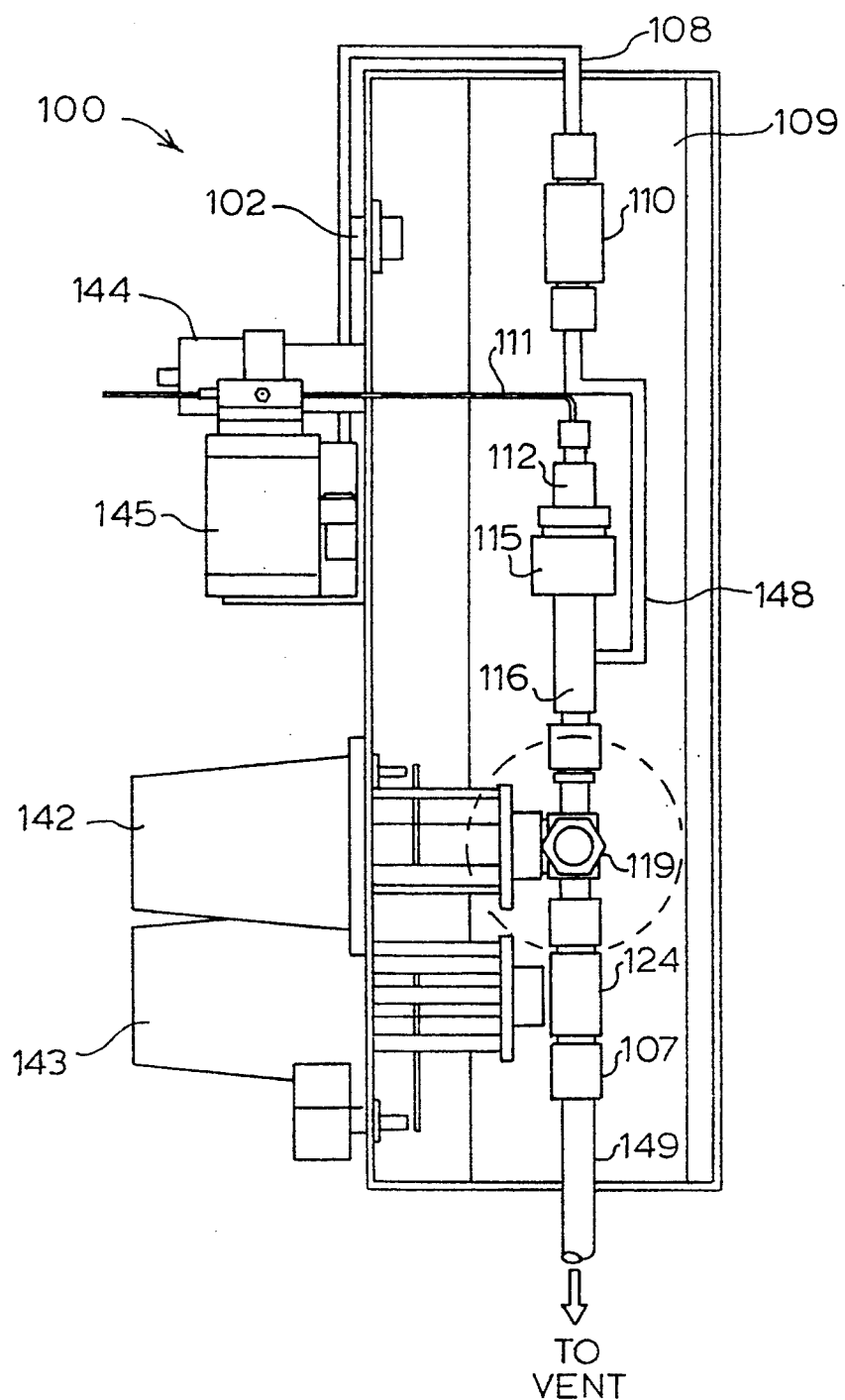
Figure 2C:
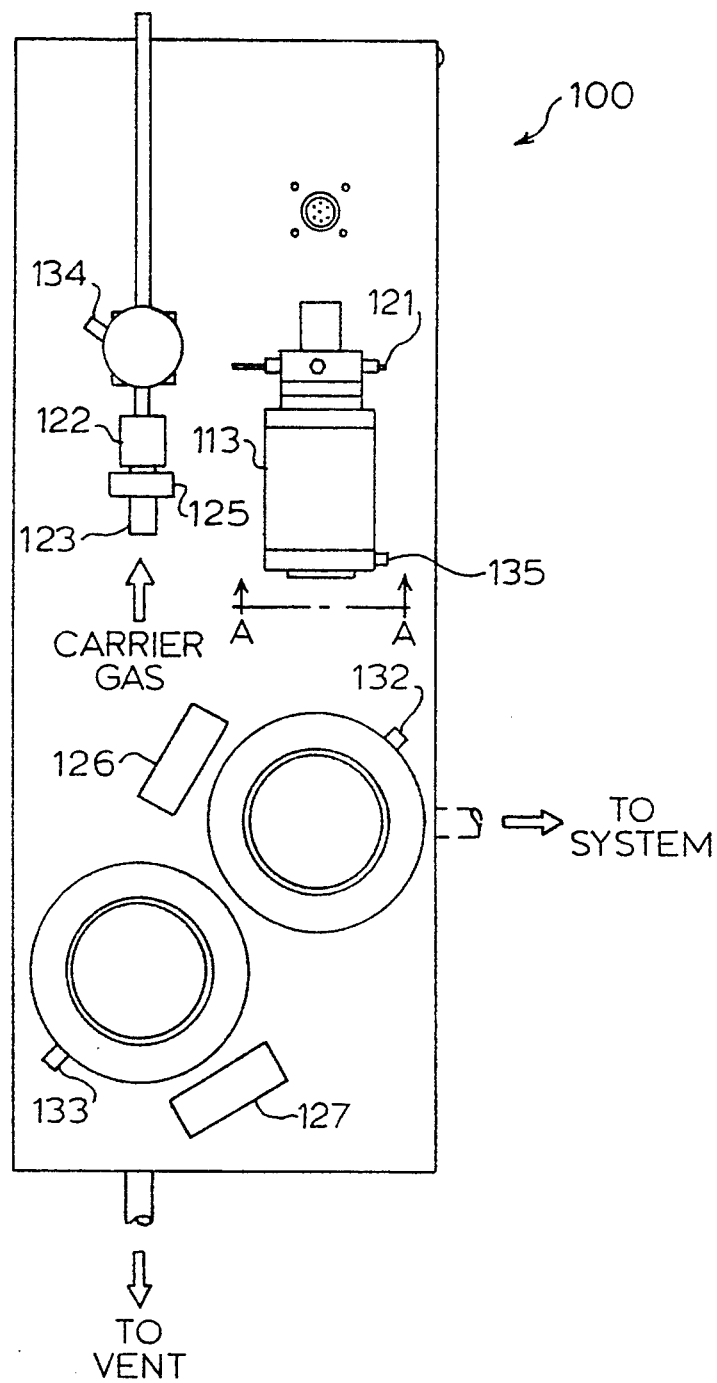

FIGS. 2a, 2b and 2c are cutaway views from three angles successively rotated 90° of a vaporizer assembly 100 incorporating the cleaning subassembly of the present invention. The view of FIG. 2b is rotated 90° about the vertical axis from FIG. 2a. The view of FIG. 2c is rotated 180° about the vertical axis from FIG. 2a. These drawings were used in the construction of a functional vaporizer assembly with self-cleaning capability. The assembly is mounted in casing 101.

In the film deposition mode, on-off valve 119 is open, on-off valve 124 is closed, and three-way valve 113 is opened for reagent flow to the vaporizer and closed to cleaning fluid flow to the vaporizer. Source reagent liquid or solution flows in through line 111 via the vaporizer element housings 112 and 115 to the vaporization zone 116. Carrier gas flows in through valve fittings 122 and 123 and check valve 125 through conduit 108 and thence through particle filter 110, which may advantageously be used also as a gas pre-heat zone, because of the particle filter's high surface area. The filtered carrier gas flows then flows through conduit 148 and is introduced to vaporization zone 116, where it mixes with the source reagent. Downstream of vaporization zone 116, the carrier gas laden with vapor phase source reagent flows into the reactor through valve 119 which is open.

In the vaporizer cleaning mode, three-way valve 113 is opened to cleaning fluid flow to the vaporizer, and is closed to reagent flow. On-off valve 119 is closed, isolating the CVD reactor from the vaporizer cleaning process. During cleaning, on-off valve 124 may either be opened or may be initially closed and then opened for flow of used cleaning fluid to a fluid collection reservoir or gas trap (not shown), depending on the flow and pressure requirements of the cleaning process. Cleaning fluid flows in via cleaning fluid port 121 through line 111 via the vaporizer element housings 112 and 115 to the vaporization zone 116. Used cleaning fluid flows out of the vaporization zone via valve 124, fitting 107, and conduit 149 to a fluid collection reservoir or gas trap (not shown).

During both deposition and cleaning modes, the temperature of the vaporizer assembly is controlled. Power plug and thermocouple connections are provided through connector 102, which provides power to heater blanket 109. Heating is controlled in four zones, which are monitored by thermocouples 128 (measures temperature of the vaporization zone 116), 129 (measures temperature of the run/vent junction 118), 130 (measures temperature of the vent valve 124), and 131 (measures temperature of the valve 119 leading to the reactor chamber). Independent control of these zones provides for the fine tuning required to provide process stability and reproducibility.

In this example apparatus, the valves are controlled pneumatically, although other modes of control such as manual or electromechanical are also possible. Pneumatic control connections 132, 133, 134, and 135 and pneumatic valve actuators 142, 143, 144 and 145 to valves 119, 124, 125 and 113 respectively are provided. Valve status indicators 126 and 127 show the positions of valves 119 and 124 respectively. The control of the valves may be manual, by timer, or may be driven by a programmable logic device which is capable of responding to signals from process variable sensors.

The invention is also applicable to conventional vaporizers in which the chemical vapor deposition reagent reservoir (or "bubbler") is itself the vaporizer, and hence the generation and accumulation of involatile compounds proceeds by the same mechanisms as described above for vaporizers of compounds that are remotely delivered by a pump as-needed in the process.

The invention may in addition comprise sensing means or a timer mechanism to determine the frequency of the cleaning cycles. Such a sensing mechanism could detect a pressure differential across the vaporizer, the fluid conductance through the vaporizer, light reflectance off the vaporizer structure which would be altered by the build up of solids, radial thermal conductance of the vaporizer, or feedback from the properties of the growing films. All such measurable properties could be used to provide an indication that the vaporizer's performance was deteriorating and it needed to be cleaned. Alternatively, in well-characterized deposition systems, the cleaning cycles could be triggered by a timer. Such an approach has the advantage of simplicity and predictability.

The vaporizer cleaning method of the present invention may optionally include a liquid collection reservoir as shown in FIG. 1. This liquid collection reservoir provides a number of practical advantages. The lifetime or time between changeouts or regenerations of the scrubber or cold trap may be extended. Alternatively, the liquid being collected may be recycled and reused as cleaning fluid or if the source reagent is a highly valuable solid compound that is being deposited prematurely on the vaporizer, it can be repurified and reused. If the source reagent is toxic, as are barium or thallium compounds for example, the collected liquid contaminated by the toxic substance can provide a more concentrated and easier-to-handle form of the hazardous waste for disposal purposes than would the spent scrubber or more dilute trap residue if the fluid were allowed to flow further into the scrubber or trap 32.

In cases where the liquid is contaminated by toxic reagents that may be hazardous to handle, it may be desirable to incorporate a scavenging medium into the liquid collection reservoir, such as a solid, porous chemisorbent, to increase the safety of the personnel responsible for running the reactor. If the cleaning fluid is a strong acid, it may be desirable to neutralize or immobilize it in situ, again for the purpose of enhancing safety. It may also be desirable to control the temperature of the liquid reservoir so that it functions to some degree as a cold trap.

The cleaning fluid is selected on the basis of several criteria, which include:

1) The fluid should dissolve the CVD source and decomposition products or should react with them to form soluble products.

2) To protect the integrity of the process, the fluid should be free of particles.

3) The fluid should have a high vapor pressure (>200 torr at room temperature).

As guidance for selection of an appropriate fluid, it should be kept in mind that in many cases deposits that occur on the vaporizer will be chemically very similar to the film being grown in the process. If barium titanate is being grown, there is likely to be largely barium titanate being deposited on the vaporizer. The appropriate fluid could therefore be selected on the basis of being a good etchant for barium titanate. On the other hand, if the source reagent is quite involatile, such as $Ba(thd)_2$, the deposits are likely to be mostly unreacted source reagent, and the organic solvent that the reagent is dissolved in will be a good choice as a cleaning fluid.

Solid reagents such as those described in U.S. patent application Ser. No. 07/807,807, "Method for Delivering an Involatile Reagent in Vapor Form to a CVD Reactor," the disclosure of which hereby is incorporated herein by reference, are customarily dissolved in a low-boiling alcohol or ether solvent such as isopropanol or tetrahydrofuran or isopropanol/tetrahydrofuran mixtures. The added low volatility liquid can advantageously be a polyether such as tetraglyme (tetraethylene glycol dimethyl ether, boiling point ~275° C.) or triglyme (triethylene glycol dimethyl ether, boiling point ~216° C.). Polyamines such as tetraethylenepentamine (boiling point 340°) or triethylenetetramine (boiling point 266°–267° C.) could also be selected. These low volatility liquids are soluble in the alcohol or ether solvent and also dissolve the solid reagents. For example, when the solvent is isopropanol or an isopropanol/tetrahydrofuran mixture and the solid reagent is a metal beta-diketonate complex, tetraglyme has been shown to be effective as the low volatility liquid. A typical solution is exemplified by 0.1M barium(thd)$_2$ (bis(2,2,6,6-tetramethyl-3,5-heptanedionato)barium) dissolved in 9:1 isopropanol:tetraglyme.

In some cases the cleaning fluid should be a vapor, such as the use of HF to clean deposits of oxides such as tantalum oxide. In some situations it may be necessary to include the capability to flow more than one cleaning fluid onto the vaporization structure. Such a requirement would necessitate the inclusion of one or more additional cleaning fluid reservoirs as well as associated conduits and valves. It may also be desirable to include the capability to flow the cleaning fluid at elevated or reduced pressures. If the built up material being dissolved off of the vaporization structure is likely to reprecipitate, it may be necessary to heat the conduit from the vaporizer to the liquid collection reservoir.

As part of the cleaning cycle, one or more steps may be incorporated wherein the vaporizer is heated to an elevated temperature to assist in the dissolution of solid buildup.

In order to run a continuous process, it two vaporizers can be provided with automatic switching and run in parallel so that as one vaporizer is being cleaned and brought back into thermal equilibrium the other one is being used to run the CVD process.

Physical assistance may be provided to the cleaning process, consistent with process integrity. As long as minimal numbers of particles are generated and transferred into the CVD reactor, plasma or ultrasound may be used to enhance the ability of the cleaning fluid to remove solid buildup from the vaporizer.

Materials of construction of the vaporizer and the associated piping and valving must be consistent with the requirements of the process as to particle generation and other contamination issues and must be resistant to corrosion by the liquids and/or vapors being used as cleaning fluids or solvents for solid source reagents. Stainless steel is preferred.

Many possible configurations of piping and valving may be used to accomplish the present invention, as indeed many possible cleaning fluids may be selected. The following non-limiting examples describe modes of use of the present invention.

EXAMPLE 1

The in-situ cleaning method as embodied in the figures above has been used in a chemical vapor deposition process for depositing $Ba_{0.70}Sr_{0.30}TiO_3$ films for use as capacitors in microelectronic integrated circuits (IC's). In one experiment, $Ba(thd)_2(0.14M)$, $Sr(thd)_2(0.06M)$ and $Ti(O-Pr)_2(thd)_2(0.15M)$ were dissolved in a solvent constituting a 9:1 mixture of isopropanol:tetraglyme (by volume) and delivered to a vaporizer (230° C.) at 4 ml/hr for 12.5 hours. Following the deposition, brown liquid and solid residue were observed in the proximity of the vaporization zone, and approximately 13% of the Ba introduced to the vaporizer was found there. Sr and Ti were delivered to the reactor somewhat more efficiently, with 9% and 1% of those elemental species left near the vaporizer as involatile residue. To correct this problem, the vaporizer was flushed using an apparatus such as is depicted schematically in FIG. 1. A solvent was used (isopropanol in this specific case) that was effective in dissolving (and subsequently vaporizing) residual metalorganic-containing solution from inlet plumbing in the vaporizer in addition to redistributing residual metalorganic compounds in the vaporizer in such a way that they flowed into the trap either as gases or as liquids whose flow is driven by gravity.

EXAMPLE 2

Tantalum oxide, $Ta_2O_5$, is seeing expanded use in the microelectronics industry as a promising dielectric for storage capacitors in scaled down memory cells and as a gate insulator of metal-oxide-semiconductor devices. The preferred precursor for chemical vapor deposition of $Ta_2O_5$ is tantalum ethoxide [$Ta(OCH_2CH_3)_5$], a liquid with a vapor pressure of 0.1 torr at 150° C. The conversion of the liquid reagent to vapor was accomplished by a technique described in U.S. Pat. No. 5,204,314, "Method For Delivering an Involatile Reagent in Vapor Form to a CVD Reactor." Tantalum ethoxide was delivered to a vaporization zone using a dual piston metering pump at rates of 0.01 to 0.20 ml/min. The vaporization temperatures were varied from 165° C. to 185° C. and a carrier gas flow rate of 50 sccm was used. The pressures in the vaporization zone were 0.1 to 10 torr. Build-up of solid tantalum oxide or sub-oxides on the vaporization surface was observed after tens of minutes.

To address this problem, the oxide is cleaned off the vaporization surface by dissolution in aqueous hydrofluoric acid. The acid is introduced along the same pathway as the tantalum ethoxide via the three-way valve 13 as shown in FIG. 1. The solution containing the tantalum reagent decomposition products is gravity fed into the liquid collection reservoir. The surface of the vaporizer is dried under a stream of inert gas before further tantalum ethoxide is introduced onto it.

EXAMPLE 3

Titanium nitride, TiN, is a material of interest for diffusion barrier layers in silicon electronics. One precursor of interest for the MOCVD of TiN is tetrakis(diethylamido)titanium [$Ti(N(CH_2CH_3)_2)_4$]. The conversion of the liquid reagent to vapor was accomplished by a technique described in U.S. Pat. No. 5,204,314, "Method For Delivering an Involatile Reagent in Vapor Form to a CVD Reactor." A dual piston metering pump was used for delivery of 54 ml (50.2 g) of the TiN reagent. The reagent was vaporized at temperatures between 150° to 165° C. and the vapor recondensed and collected. 51 ml (47.4 g) of reagent was collected, the remaining material having been decomposed in the vaporization zone by either thermal decomposition or by reaction with atmospheric contaminants in the vaporization zone. The titanium reagent is extremely air- and moisture-sensitive, decomposing in air to dimethylamine and solid titanium oxides and/or hydroxides over the space of a few minutes.

To deal with the resulting build-up of titanium oxides on the vaporization structure, aqueous hydrofluoric acid is introduced into the vaporization zone and passed over the surface of the vaporization element. The solubility of the titanium decomposition products in the acid allows the surface to be cleaned and the solution of decomposition products to be collected as a liquid. The cleaned area is then heated to >100° C. under vacuum to remove any residual water. The titanium nitride source reagent may then be introduced into the cleaned vaporization zone and delivered as vapor to the CVD reactor chamber.

It will be recognized that the details of the the various parts of the system may vary widely. These constituent parts include: the cleaning liquid pump, the multiple position valve, the vaporizer configuration (including ports in it for introduction and removal of liquids and gases), the valves downstream of the vaporizer and the liquid and solid traps, which are shown as a single element in FIG. 1.

While the invention has been described herein with reference to specific aspects, features, and embodiments, it will be apparent that other variations, modifications, and embodiments are possible, and all such variations, modifications, and embodiments therefore are to be regarded as being within the spirit and scope of the invention.

What is claimed is:

1. An apparatus for vaporizing a source reagent of non-vapor character to produce a vapor for transport to a locus of use in a downstream deposition chamber, said apparatus comprising:

a vaporization chamber including a housing defining therewithin an enclosed interior vaporization volume;

means for feeding source reagent to the interior volume of the housing;

vaporization means disposed within the interior volume of said housing and in receiving relationship to the feed means, for receiving source reagent and effecting vaporization thereof;

a deposition chamber to which the vaporization chamber housing is joined in vaporized reagent flow relationship; and means for selectively feeding to the interior volume, for contact with the vaporization means and interior surfaces of the housing, a cleaning fluid which is cleaningly effect to at least partially remove vaporization deposits from said vaporization means and interior surfaces of the housing;

wherein the flow of cleaning fluid, source reagent, and vaporized reagent are selectively controlled with flow control means of a selectively actuatable character, and wherein the cleaning fluid feeding means and flow control means are constructed and arranged to be operated while the vaporization chamber housing remains connected to the deposition chamber.

2. An apparatus according to claim 1, wherein the flow control means are interconnected with automatic cycle timer means, to produce a sequence of vaporization of source reagent and delivery of same to the downstream deposition chamber for a predetermined first portion of the cycle, followed by cessation of flow of source reagent and vaporized reagent, and flow of cleaning fluid into the chamber for cleaning thereof.

3. Apparatus according to claim 2, wherein the cycle timer means comprise means for sensing a system variable selected from the group consisting of a pressure differential across the vaporizer, the fluid conductance through the vaporizer, light reflectance off the vaporizer structure at a wavelength where such reflectance is altered by the build up of solids, the radial thermal conductance of the vaporizer, and feedback from the properties of the growing films.

4. An apparatus according to claim 1, wherein the housing and deposition chamber are joined by a vapor supply conduit containing a selectively openable and selectively closable flow control valve.

5. An apparatus according to claim 4, wherein the vaporization chamber housing is coupled to a cleaning fluid collection reservoir for collection of cleaning fluid.

6. An apparatus according to claim 5, wherein the cleaning fluid collection reservoir is coupled by gravity-flow liquid flow means to the vaporization chamber housing, for collection of liquid-phase cleaning fluid in the cleaning collection reservoir.

7. An apparatus according to claim 6, wherein the gravity-flow liquid flow means comprises a gravity flow conduit.

8. An apparatus according to claim 7, further comprising a scrubber joined to the deposition chamber, and a bypass conduit joined at one end thereof to the scrubber and joined at the other end thereof to the gravity-flow conduit.

9. An apparatus according to claim 8, wherein the scrubber is joined to the deposition chamber by an effluent conduit.

10. An apparatus according to claim 9, further comprising flow control valves in the vapor supply conduit, gravity flow conduit, and effluent conduit, for selectively controlling flow of fluids therethrough.

11. An apparatus according to claim 10, further comprising a vacuum pump coupled to said scrubber.

12. An apparatus for vaporizing a source reagent of non-vapor character, to produce a vapor for transport to a locus of use in a downstream deposition chamber, said apparatus comprising:

a vaporization chamber including a housing defining therewithin an enclosed interior vaporization volume;

means for feeding source reagent to the interior volume of the housing;

vaporization means disposed within the interior volume of said housing and in receiving relationship to the feed means, for receiving source reagent and effecting vaporization thereof; and a downstream deposition chamber joined in vaporized reagent flow relationship to the vaporization chamber housing;

means for automatically selectively feeding to the interior volume, for contact with the vaporization means and interior surfaces of the housing, a cleaning fluid which is cleaningly effective to at least partially remove vaporization deposits from said vaporization means and interior surfaces of the housing;

wherein the flow of cleaning fluid, source fluid, and vaporized reagent are selectively controlled with automatic flow control means of a selectively automatically actuatable character.

13. A method of vaporizing a non-vapor source reagent for subsequent use of the vaporized reagent in a downstream deposition chamber, and at least partially removing decomposition by-products of such vaporization, said process comprising:

(a) providing an apparatus for vaporizing a source reagent of non-vapor character, to produce a vapor for transport to a locus of use, for deposition in the downstream deposition chamber, said apparatus comprising:

(i) a vaporization chamber including a housing defining therewithin an enclosed interior vaporization volume;

(ii) means for feeding source reagent to the interior volume of the housing;

(iii) vaporization means disposed within the interior volume of said housing and in receiving relationship to the feed means, for receiving source reagent and effecting vaporization thereof;

(iv) a downstream deposition chamber to which the vaporization chamber housing is joined in vaporized reagent flow relationship;

(v) means for selectively feeding to the interior volume, for contact with the vaporization means and interior surfaces of the housing, a cleaning fluid which is cleaningly effective to at least partially remove vaporization deposits from said vaporization means and interior surfaces of the housing;

wherein the flow of cleaning fluid, source reagent, and vaporized reagent are selectively controlled with flow control means of a selectively actuatable character, and wherein the cleaning fluid feeding means and said flow control means are constructed and arranged to be operated while the vaporization chamber housing remains connected to the downstream deposition chamber;

(b) vaporizing the source reagent in the housing for a predetermined time, and flowing resulting vaporized reagent out of the housing and to the downstream deposition chamber; and (c) after said predetermined time, terminating flow of source reagent and vaporized reagent, and flowing into said housing a cleaning fluid which is cleaningly effective for at least partial removal of deposits produced by said vaporization, while said vaporization housing chamber remains connected to the downstream deposition chamber.

* * * * *